US012800632B2

(12) United States Patent
Lidström

(10) Patent No.: US 12,800,632 B2
(45) Date of Patent: Nov. 17, 2026

(54) BATTERY CURRENT ESTIMATION

(71) Applicant: VOLVO TRUCK CORPORATION, Gothenburg (SE)

(72) Inventor: Emil Lidström, Torslanda (SE)

(73) Assignee: VOLVO TRUCK CORPORATION, Gothenburg (SE)

( * ) Notice: Subject to any disclaimer, the term of this patent is extended or adjusted under 35 U.S.C. 154(b) by 194 days.

(21) Appl. No.: 18/758,103

(22) Filed: Jun. 28, 2024

(65) Prior Publication Data

US 2025/0020707 A1 Jan. 16, 2025

(30) Foreign Application Priority Data

Jul. 12, 2023 (EP) .................................... 23185038

(51) Int. Cl.

*G01R 27/08* (2006.01)
*G01R 31/382* (2019.01)
*H01M 10/48* (2006.01)
*H01M 50/502* (2021.01)
*H01M 50/569* (2021.01)

(52) U.S. Cl.

CPC ........... *G01R 27/08* (2013.01); *G01R 31/382* (2019.01); *H01M 10/482* (2013.01); *H01M 50/502* (2021.01); *H01M 50/569* (2021.01); *H01M 2220/20* (2013.01)

(58) Field of Classification Search

CPC .............. G01R 31/382; G01R 31/3842; G01R 31/389; G01R 31/396; G01R 27/08

See application file for complete search history.

(56) References Cited

U.S. PATENT DOCUMENTS 6,304,062 B1 * 10/2001 Batson .................. H01M 10/48 320/136
6,983,212 B2 * 1/2006 Burns ....................... H02J 7/56 324/431
7,589,534 B2 9/2009 Lee
9,733,311 B2 8/2017 Itagaki et al.
10,649,040 B2 5/2020 Ollitrault et al.

(Continued)

FOREIGN PATENT DOCUMENTS

DE 102014007304 A1 1/2015
GB 2610154 A 3/2023
KR 20160080207 A 7/2016

OTHER PUBLICATIONS

Extended European Search Report in corresponding European Application No. 23185038.9 dated Jan. 3, 2024 (11 pages).

(Continued)

*Primary Examiner* — Tung X Nguyen

(74) *Attorney, Agent, or Firm* — Jeffri A. Kaminski; Venable LLP

(57) ABSTRACT

A computer system comprising processing circuitry is presented. The processing circuitry is configured to obtain resistance data of a plurality of inter-cell connectors of a battery pack comprising a plurality of battery cells, and obtain inter-cell voltage drops across the plurality of inter-cell connectors. The processing circuitry is further configured to determine inter-cell currents based on the resistance data and associated inter-cell voltage drops; and determine a battery pack current estimate of a battery pack current of the battery pack based on the inter-cell currents.

17 Claims, 6 Drawing Sheets

(56) References Cited

U.S. PATENT DOCUMENTS

| | | | | |
|---|---|---|---|---|
| 2011/0279124 | A1* | 11/2011 | Hansen | G01R 31/396 324/429 |
| 2014/0278174 | A1 | 9/2014 | Biskup et al. | |
| 2020/0088800 | A1 | 3/2020 | Hess | |

OTHER PUBLICATIONS

Bobby Rian Dewangga et al: "Battery Current Estimation Based on Simple Model with Parameter Update Strategy Using Piecewise Linear SOC-OCV"; 2018 4th International Conference on Science and Technology (ICST), IEEE, vol. 1, Aug. 7, 2018, pp. 1-6, XP033442657, DOI: 10.1109/ICSTC.2018.8528694.

* cited by examiner

BATTERY CURRENT ESTIMATION

TECHNICAL FIELD

The disclosure relates generally to power control. In particular aspects, the disclosure relates to battery current estimation. The disclosure can be applied marine vessels, industrial applications and vehicles, specifically heavy-duty vehicles, such as trucks, buses, and construction equipment, among other vehicle types. Although the disclosure may be described with respect to a particular vehicle, the disclosure is not restricted to any particular vehicle.

BACKGROUND

Any battery power system or device will generally benefit from estimating a current provided by the battery. The current from the battery (or to the battery during charging) will, in addition to providing an indication of a power consumption of the system or device, further indicate any potential problems indicted by an unexpectedly high or low current.

Generally, in electrically propelled vehicles, current sensors are provided to monitor and detect current going into the traction battery and currents provided by the traction battery. In response to detection of abnormal currents, it is not uncommon for computer systems of the vehicle to be configured to (temporarily) prevent current transfer to/from the battery. To this end, high integrity and reliability in current measurement is important. The high integrity and reliability is advantageous in order to e.g. not damage battery cells by charging with too high currents due to incorrect current reading, or not to erroneously detect too high currents causing an unwanted stop of the usage of the batteries.

SUMMARY

According to a first aspect of the disclosure, a computer system comprising processing circuitry is presented. The processing circuitry is configured to obtain resistance data of a plurality of inter-cell connectors of a battery pack comprising a plurality of battery cells and obtain inter-cell voltage drops across the plurality of inter-cell connectors. The processing circuitry is further configured to determine inter-cell currents based on the resistance data and associated inter-cell voltage drops, and determine a battery pack current estimate of a battery pack current of the battery pack based on the inter-cell currents. The first aspect of the disclosure may seek to increase the accuracy, integrity and/or reliability of current measurements provided by a current sensor of a battery pack. A technical benefit may include reduced risk of erroneous measurements of currents, cheaper battery pack as the current sensor may be omitted. A technical benefit may include that basing the estimate on a plurality a currents cause the estimate to converge to a normal distribution by the central limiting theorem.

Optionally in some examples, including in at least one preferred example, the processing circuitry is further configured to determine an inter-cell current average as a mean of the inter-cell currents, and determine the battery pack current estimate based on the inter-cell current average. A technical benefit may include averaging a plurality a currents causing their mean to converge to the true mean of the current by the central limiting theorem and law of large numbers.

Optionally in some examples, including in at least one preferred example, the processing circuitry is further configured to determine an inter-cell current estimate standard deviation as a standard deviation of the inter-cell current average and, for each inter-cell connector exhibiting an inter-cell current being outside a predefined confidence interval of the inter-cell current average, determine that the inter-cell connector is malfunctioning. A technical benefit may include detecting that there is a potential issue with an inter-cell connector, or a sensor associated with that inter-cell connector.

Optionally in some examples, including in at least one preferred example, the processing circuitry is further configured to obtain, from a battery pack current sensor, a battery pack current of the battery pack current and determine a delta current indicator by comparison of the battery pack current and the battery pack current estimate. The processing circuitry is further configured to, responsive to the delta current indicator being outside a permissible error range, determining that the battery pack current sensor is malfunctioning. A technical benefit may include detecting that there is a problem with the battery pack current sensor.

Optionally in some examples, including in at least one preferred example, the processing circuitry is further configured to determine a delta current shift by comparison of the delta current indicator with one or more previous delta current indicators, and responsive to the delta current shift being outside a permissible deviation range, determining that the battery pack current sensor is malfunctioning. A technical benefit may include detecting that there is a problem with the battery pack current sensor.

Optionally in some examples, including in at least one preferred example, the processing circuitry is further configured to, responsive to determining that the battery pack current sensor is malfunctioning, determine that further transfer of power to/from the battery pack is allowed based on the battery pack current estimate. A technical benefit may include allowing the battery back to continue to provide power to a load regardless of the malfunctioning battery pack current sensor as accurate current estimations are provided by the battery pack current estimate.

Optionally in some examples, including in at least one preferred example, the processing circuitry is further configured to update the resistance data of one or more of the plurality of inter-cell connectors based on the battery pack current estimate and inter-cell voltage drops across the plurality of inter-cell connectors. A technical benefit may include ensuring that the resistance data is correct and compensate for ageing, wear etc. of the inter-cell connectors.

Optionally in some examples, including in at least one preferred example, the processing circuitry is further configured to update the resistance data of one or more of the plurality of inter-cell connectors based on time series data of inter-cell voltage drops across the plurality of inter-cell connectors. A technical benefit may include ensuring that the resistance data is correct and compensate for ageing, wear etc. of the inter-cell connectors.

Optionally in some examples, including in at least one preferred example, the processing circuitry is further configured to update the resistance data of one or more of the plurality of inter-cell connectors based on a battery pack current obtained from a battery pack current sensor of the battery pack. A technical benefit may include ensuring that the resistance data is correct and compensate for ageing, wear etc. of the inter-cell connectors.

Optionally in some examples, including in at least one preferred example, the processing circuitry is further configured to determine an inter-cell current average as a mean of the inter-cell currents, and determine the battery pack current estimate based on the inter-cell current average; determine an inter-cell current estimate standard deviation as a standard deviation of the inter-cell current average, for each inter-cell connector exhibiting an inter-cell current being outside a predefined confidence interval of the inter-cell current average, determine that the inter-cell connector is malfunctioning; obtain, from a battery pack current sensor, a battery pack current of the battery pack current, determine a delta current indicator by comparison of the battery pack current and the battery pack current estimate, and responsive to the delta current indicator being outside a permissible error range, determining that the battery pack current sensor is malfunctioning; responsive to determining that the battery pack current sensor is malfunctioning, determine that further transfer of power to/from the battery pack is allowed based on the battery pack current estimate; and update the resistance data of one or more of the plurality of inter-cell connectors based on the battery pack current estimate and inter-cell voltage drops across the plurality of inter-cell connectors, and/or time series data of inter-cell voltage drops across the plurality of inter-cell connectors. A technical benefit may include ensuring that the resistance data is correct and compensate for ageing, wear etc. of the inter-cell connectors. A technical benefit may include allowing the battery back to continue to provide power to a load regardless of the malfunctioning battery pack current sensor as accurate current estimations are provided by the battery pack current estimate. A technical benefit may include detecting that there is a problem with the battery pack current sensor. A technical benefit may include detecting that there is a potential issue with an inter-cell connector, or a sensor associated with that inter-cell connector. A technical benefit may include averaging a plurality a currents causing their mean to converge to the true mean of the current by the central limiting theorem and law of large numbers.

According to a second aspect of the disclosure, a vehicle is presented. The vehicle comprises an electric propulsion source, a battery pack operatively connected to the computer system of the first aspect and configured to provide power to the electric propulsion source. A technical benefit may include reduced risk of erroneous measurements of currents, cheaper battery pack as the current sensor may be omitted. A technical benefit may include that basing the estimate on a plurality a currents cause the estimate to converge to a normal distribution by the central limiting theorem.

Optionally in some examples, including in at least one preferred example, the vehicle is a heavy-duty vehicle.

According to a third aspect of the disclosure, a computer implemented method is presented. The method comprises obtaining, by a processing circuitry of a computer system, resistance data of a plurality of inter-cell connectors of a battery pack comprising a plurality of battery cells, and obtaining, by the processing circuitry of the computer system, inter-cell voltage drops across the plurality of inter-cell connectors. The method further comprises determining, by the processing circuitry of the computer system, inter-cell currents based on the resistance data and associated inter-cell voltage drops, and determining, by the processing circuitry of the computer system, a battery pack current estimate of a battery pack current of the battery pack based on the inter-cell currents.

Optionally in some examples, including in at least one preferred example, the method further comprises determining, by the processing circuitry of the computer system, an inter-cell current average as a mean of the inter-cell currents, and determining, by the processing circuitry of the computer system, the battery pack current estimate based on the inter-cell current average. A technical benefit may include averaging a plurality a currents causing their mean to converge to the true mean of the current by the central limiting theorem and law of large numbers.

Optionally in some examples, including in at least one preferred example, the method further comprises determining, by the processing circuitry of the computer system, an inter-cell current estimate standard deviation as a standard deviation of the inter-cell current average, and for each inter-cell connector exhibiting an inter-cell current being outside a predefined confidence interval of the inter-cell current average, determining, by the processing circuitry of the computer system, that the inter-cell connector is malfunctioning. A technical benefit may include detecting that there is a potential issue with an inter-cell connector, or a sensor associated with that inter-cell connector.

Optionally in some examples, including in at least one preferred example, the method further comprises obtaining, by the processing circuitry of the computer system, from a battery pack current sensor, a battery pack current of the battery pack current, and determining, by the processing circuitry of the computer system, a delta current indicator by comparison of the battery pack current and the battery pack current estimate. The method further comprises responsive to the delta current indicator being outside a permissible error range, determining, by the processing circuitry of the computer system, that the battery pack current sensor is malfunctioning. A technical benefit may include detecting that there is a problem with the battery pack current sensor.

Optionally in some examples, including in at least one preferred example, the method further comprises determining, by the processing circuitry of the computer system, a delta current shift by comparison of the delta current indicator with one or more previous delta current indicators, and responsive to the delta current shift being outside a permissible deviation range, determining, by the processing circuitry of the computer system, that the battery pack current sensor is malfunctioning. A technical benefit may include detecting that there is a problem with the battery pack current sensor.

Optionally in some examples, including in at least one preferred example, the method further comprises, responsive to determining that the battery pack current sensor is malfunctioning, determining, by the processing circuitry of the computer system, that further transfer of power to/from the battery pack is allowed based on the battery pack current estimate. A technical benefit may include allowing the battery back to continue to provide power to a load regardless of the malfunctioning battery pack current sensor as accurate current estimations are provided by the battery pack current estimate.

Optionally in some examples, including in at least one preferred example, the method further comprises, updating, by the processing circuitry of the computer system, the resistance data of one or more of the plurality of inter-cell connectors based on the battery pack current estimate and inter-cell voltage drops across the plurality of inter-cell connectors, and/or time series data of inter-cell voltage drops across the plurality of inter-cell connectors. A technical benefit may include ensuring that the resistance data is correct and compensate for ageing, wear etc. of the inter-cell connectors.

Optionally in some examples, including in at least one preferred example, the method further comprises, updating, by the processing circuitry of the computer system, the resistance data based on the battery pack current. A technical benefit may include ensuring that the resistance data is correct and compensate for ageing, wear etc. of the inter-cell connectors.

According to a fourth aspect of the disclosure, a computer program product is presented. The computer program product comprises program code for performing, when executed by a processing circuitry, the method of the third aspect.

According to a fifth aspect of the disclosure, a non-transitory computer-readable storage medium comprising instructions, which when executed by a processing circuitry, cause the processing circuitry to perform the method of the third aspect.

The disclosed aspects, examples (including any preferred examples), and/or accompanying claims may be suitably combined with each other as would be apparent to anyone of ordinary skill in the art. Additional features and advantages are disclosed in the following description, claims, and drawings, and in part will be readily apparent therefrom to those skilled in the art or recognized by practicing the disclosure as described herein.

There are also disclosed herein computer systems, control units, code modules, computer-implemented methods, computer readable media, and computer program products associated with the above discussed technical benefits.

BRIEF DESCRIPTION OF THE DRAWINGS

Examples are described in more detail below with reference to the appended drawings.

DETAILED DESCRIPTION

The detailed description set forth below provides information and examples of the disclosed technology with sufficient detail to enable those skilled in the art to practice the disclosure.

Figure 1A:
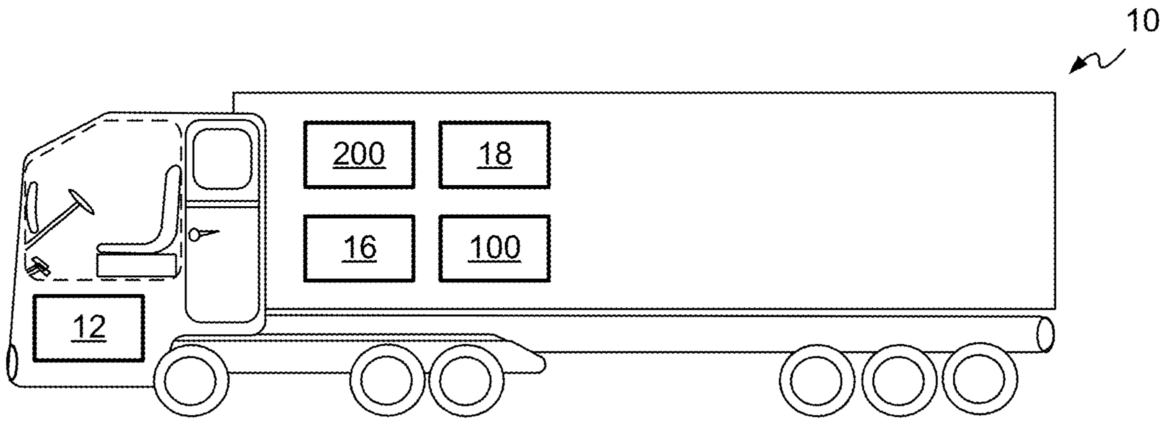
FIG. 1A is an exemplary side view of a vehicle according to an example.

FIG. 1A is an exemplary schematic side view of a heavy-duty vehicle 10 (hereinafter referred to vehicle 10 for reasons of brevity). This particular vehicle 10 comprises a tractor unit 10*a* which is arranged to tow a trailer unit 10*b*. In other examples, other heavy-duty vehicles may be employed, e.g., trucks, buses, and construction equipment. Although not explicitly visualized in FIG. 1A, the skilled person will appreciate that the vehicle 10 comprises all necessary vehicle units and associated functionality such that it may operate as the skilled person would expect of a vehicle 10, such as a powertrain, chassis, and various control systems. Emphasis in the present disclosure is rather directed at electrical currents of the vehicle 10, and therefore functionality and features related this will be the focus of the present disclosure. However, the vehicle 10 comprises one or more propulsion sources 12. The propulsion source 12 may be any suitable propulsion source 12 exemplified by, but not limited to, one or more or a combination of an electrical motor, a combustion engine such as a diesel, gas or gasoline powered engine. At least one propulsion source 12 is an electrical motor. The vehicle 10 further comprises at least one energy source 200 suitable for providing energy for the propulsion source(s) 12. That is to say, as at least one propulsion source 12 is an electrical motor, at least one propulsion source 12 is a battery pack 200. The vehicle 10 further comprises sensor circuitry 16 arranged to detect, measure, sense or otherwise obtain data relevant for operation of the vehicle 10. The data relevant for operation of the vehicle 10 may be exemplified by, but not limited to, one or more of a voltage of the battery pack 200, a current provided by the battery pack 200, a speed of the vehicle 10, a weight of the vehicle 10, an inclination of the vehicle 10, a status (state of charge, fuel level etc.) of the energy source 200 of the vehicle 10 etc. Advantageously, the vehicle 10 further comprises communications circuitry 18 configured for communication with, to the vehicle 10, external devices. The vehicle 10 further comprises a computer system 100.

Figure 1B:
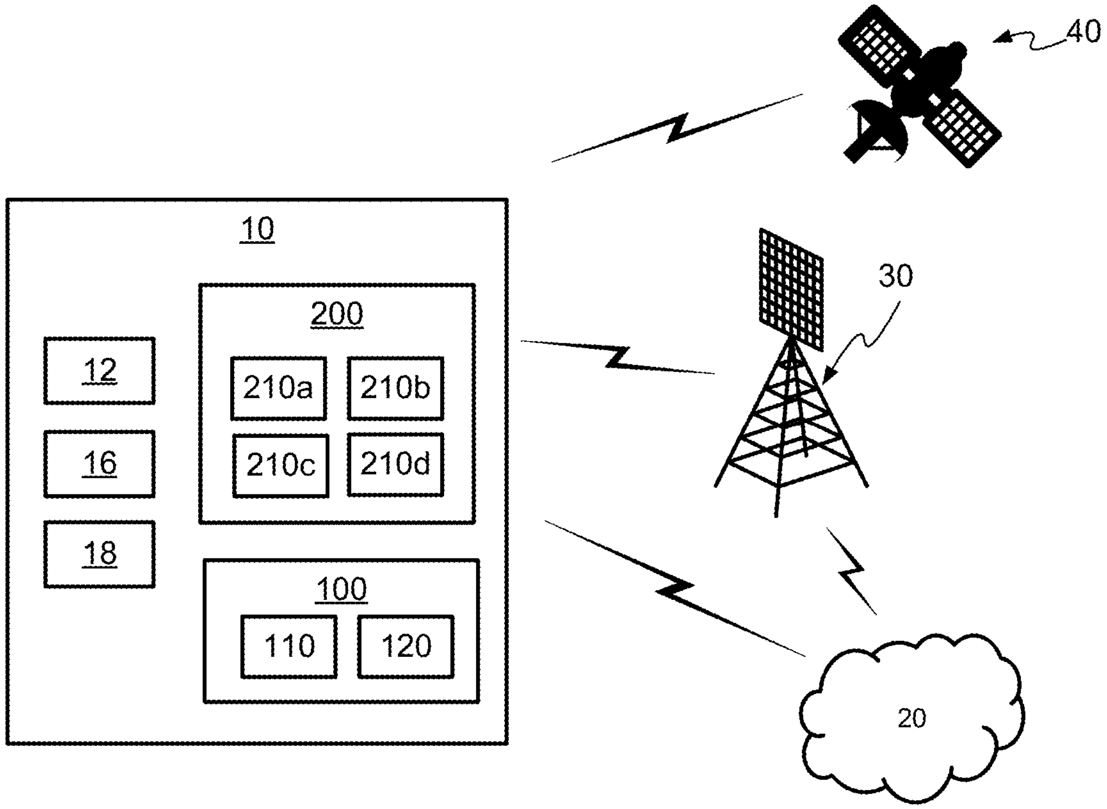
FIG. 1B is an exemplary block view of a vehicle according to an example.

As shown in FIG. 1B, the vehicle 10 may communicate with a cloud server 20 using the communications circuitry 18. The communications circuitry 18 may be configured to communicate with the cloud server 20 directly, or via a communications interface such as a cellular communications interface exemplified by a radio base station 30 in FIG. 1B. The cloud server 20 may be any suitable cloud server exemplified by, but not limited to, Amazon Web Services (AWS), Microsoft Azure, Google Cloud Platform (GCP), IBM Cloud, Oracle Cloud Infrastructure (OCI), DigitalOcean, Vultr, Linode, Alibaba Cloud, Rackspace etc. The communications interface is advantageously a wireless communications interface exemplified by, but not limited to, Wi-Fi, Bluetooth, Zigbee, Z-Wave, LoRa, Sigfox, 2G (GSM, CDMA), 3G (UMTS, CDMA2000), 4G (LTE), 5G (NR) etc. The vehicle 10 may further, via the communications circuitry 18, be operatively connected to a Global Navigation Satellite System (GNSS) 40 exemplified by, but not limited to, global positioning system (GPS), Globalnaya Navigatsionnaya Sputnikovaya Sistema (GLONASS), Galileo, BeiDou Navigation Satellite System, Navigation with Indian Constellation (NavIC) etc. The vehicle 10 may be configured to utilize data obtain from the GNSS 40 to determine a geographical location of the vehicle 10.

The computer system 100 of the vehicle 10 is advantageously operatively connected to the communications circuitry 18, the sensor circuitry 16, the energy source 200 and/or the propulsion source 12 of the vehicle 10. The computer system 100 comprises processing circuitry 110. The computer system 100 may comprise a storage device 120, advantageously a non-volatile storage device such as a hard disk drives (HDDs), solid-state drives (SSDs) etc. In some examples, the storage device 120 is operatively connected to the computer system 100.

As mentioned, a vehicle 10 according to the present disclosure is an, at least partly, electrically propelled vehicle. To this end, the vehicle 10 of the present disclosure comprises at least one energy source 200 in the form of an electrical energy source 200, i.e. at least one battery pack 200. The vehicle battery pack 200 comprises at least two battery cells 210*a*, 210*b*, 210*c*, 210*d*. In FIG. 1B, the battery pack 200 is shown comprising four battery cells 210*a*, 210*b*, 210*c*, 210*d*. However, this is for illustrative purposes, and the battery pack 200 may comprise any number of battery cells 210*a*, 210*b*, 210*c*, 210*d*. The battery cells 210*a*, 210*b*, 210*c*, 210*d*. The battery pack 200 is advantageously configured to provide energy at least to the propulsion source 12 of the vehicle 10. Additionally, or alternatively, the battery pack 200 may be configured to provide energy to other part components of the vehicle 10 such as, but not limited to, vehicle electronics, climate control of the vehicle 10, safety functions of the vehicle etc.

Regardless of the load, it may be advantageous to, as previously indicated, accurately estimate a current provided by the battery pack 200 to the load. Accurate current data assists in assessing a health and performance of the battery pack 200. By monitoring a current to/from the battery pack 200, charging and discharging patterns may be tracked, abnormal behaviors may be identified, and potential issues like overcharging, undercharging, or excessive discharge (short circuit) may be detected. Accurate current measurements enables evaluation of a battery state of charge and state of health of the battery pack 200, ensuring optimal performance and extending battery life. Battery packs 200, when used as traction batteries, generally store a significant amount of energy which increases a risk that abnormal behaviors may lead to hazardous conditions, such as overheating, thermal runaway, or electrical failures. Further to this, accurate current measurements aid in optimizing an energy efficiency of the vehicle 10. By monitoring a current during charging and/or discharging, an efficiency of a battery pack 200 may be evaluated and opportunities for improvement may be identified. The above notwithstanding, current measurements provide valuable data for performance analysis and diagnostics. By analyzing current profiles during various driving conditions and operations, it is possible to gain insights into energy usage, power demand, efficiency, etc. of the vehicle 10. This information may assist in diagnosing performance issues, optimizing system configurations, and/or identifying areas for improvement in terms of energy consumption and overall vehicle performance. Further, accurate current measurements are generally required for compliance with regulatory standards and industry guidelines. Many standards and regulations set specific limits on battery current for safety and operational reasons. By accurately measuring and documenting the current, it is possible to demonstrate compliance with these standards and ensure the vehicle 10 meets the necessary requirements.

The inventor behind the present disclosure have identified the importance of current measurements. By inventive thinking and challenging of the technical prejudice of the present technical field, devised an alternative method and system for estimating current to/from a battery pack 200. The teachings of the present disclosure may be utilized to ensure accuracy of a prior art battery pack current sensor, to replace a prior art battery pack current sensor, to calibrate a prior art battery pack current sensor etc. The importance of the current measurements in batteries causes the skilled person to stay with known prior art battery pack current sensors and provide redundancy by adding further current sensors rather than thinking outside the box and implementing the teachings of the present disclosure.

Figure 2:
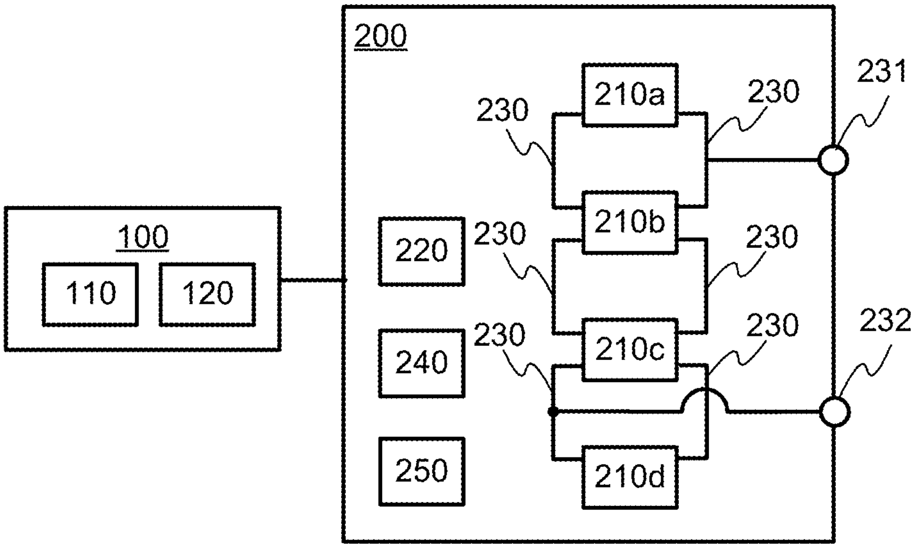
FIG. 2 is an exemplary block view of a battery pack according to an example.
Figure 3:
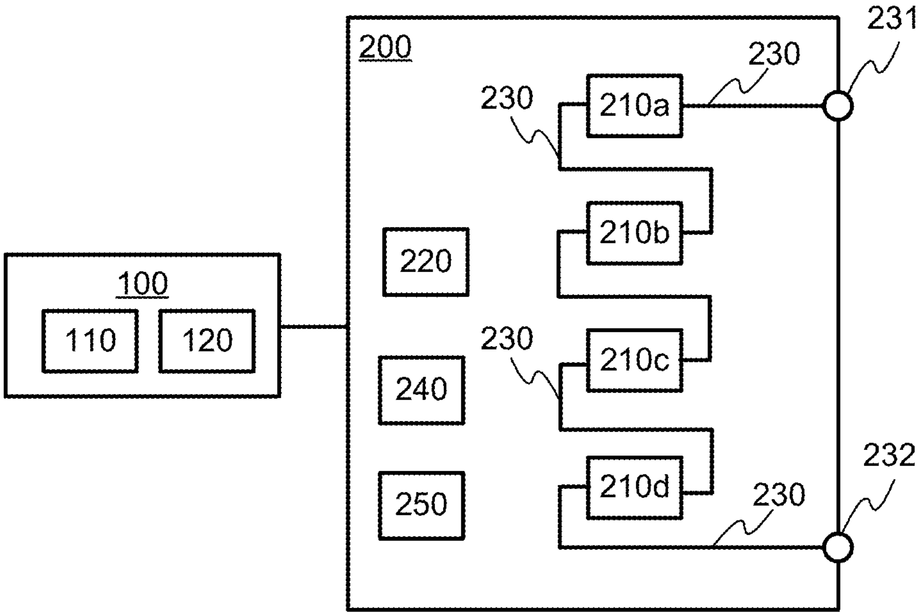
FIG. 3 is an exemplary block view of a battery pack according to an example.

With reference to FIG. 2 and FIG. 3, battery packs 200 according to some examples will be explained. The battery pack 200 comprises, as previously indicated, at least two battery cells 210*a*, 210*b*, 210*c*, 210*d*. In FIG. 2, the battery pack 200 is shown comprising four battery cells 210*a*, 210*b*, 210*c*, 210*d*. The battery cells 210*a*, 210*b*, 210*c*, 210*d* are connected by inter-cell connectors 230. The inter-cell connectors 230 are electrically conducting members exemplified by, but not limited to, one or more or combination of busbars, interconnect cables, cell-to-cell weldings, screws etc. The battery pack 200 advantageously comprise a battery pack processing circuitry 220. The battery pack processing circuitry 220 may for part of the computer system 100 and the processing circuitry 110 of the computer system 100. The battery pack processing circuitry 220 is configured to monitor operation of the battery pack 200. To this end, the battery pack processing circuitry 220 is operatively connected to (or comprises) one or more battery pack sensor circuitry 240. The battery pack sensor circuitry 240 may be configured to measure, sense or otherwise obtain operational data of the battery pack 200. The operational data of the battery pack 200 may comprise one or more voltages of the battery pack 200, one or more currents of the battery pack 200, one or more temperatures of the battery pack 200 etc. Generally, a resistance of the inter-cell connectors 230 is determined/calibrated during manufacturing and/or during design of the battery pack 200. The resistance of the inter-cell connectors 230 is advantageously stored in non-volatile storage circuitry (not shown in FIG. 2 or FIG. 3) accessible by the computer system 100. The battery pack 200 further comprises two or more connectors 231, 232 operatively connected to the battery cells 210*a*, 210*b*, 210*c*, 210*d*. Generally, a first connector 231 is operatively connected to a first voltage potential of the battery cells 210*a*, 210*b*, 210*c*, 210*d* and a second connector 232 is operatively connected to a second voltage potential of the battery cells 210*a*, 210*b*, 210*c*, 210*d*. The battery pack 200 further comprises a battery pack current sensor 250 configured to detect, measure or otherwise obtain a current provided to or by the two or more connectors 231, 232.

The inter-cell connectors 230 may be configured to connect the battery cells 210*a*, 210*b*, 210*c*, 210*d* in series, in parallel or a combination of series or parallel connections. The configuration of the inter-cell connectors 230 will depend on a number of battery cells 210*a*, 210*b*, 210*c*, 210*d*, a capacity of the battery cells 210*a*, 210*b*, 210*c*, 210*d* a voltage of the battery cells 210*a*, 210*b*, 210*c*, 210*d* and a wanted voltage of the battery pack 200. The inter-cell connectors 230 connect the battery cells 210*a*, 210*b*, 210*c*, 210*d* in order to provide a rated capacity from the battery pack 200 and a rated voltage difference between the first potential (a voltage of the first connector 231) and the second potential (a voltage of the second connector 232) of the battery pack 200. In some examples, a rated voltage of the energy source is approximately 800 V.

In FIG. 2 the inter-cell connectors 230 are configured to connect the battery cells 210*a*, 210*b*, 210*c*, 210*d* in parallel. In FIG. 3, the inter-cell connectors 230 are configured to connect the battery cells 210*a*, 210*b*, 210*c*, 210*d* in series.

The battery packs 200 shown in FIG. 2 and FIG. 3 are simplified block diagrams. The skilled person will appreciate that the battery packs 200 advantageously comprise further features such as pre-charge circuitry, fuses etc.

Figure 4:
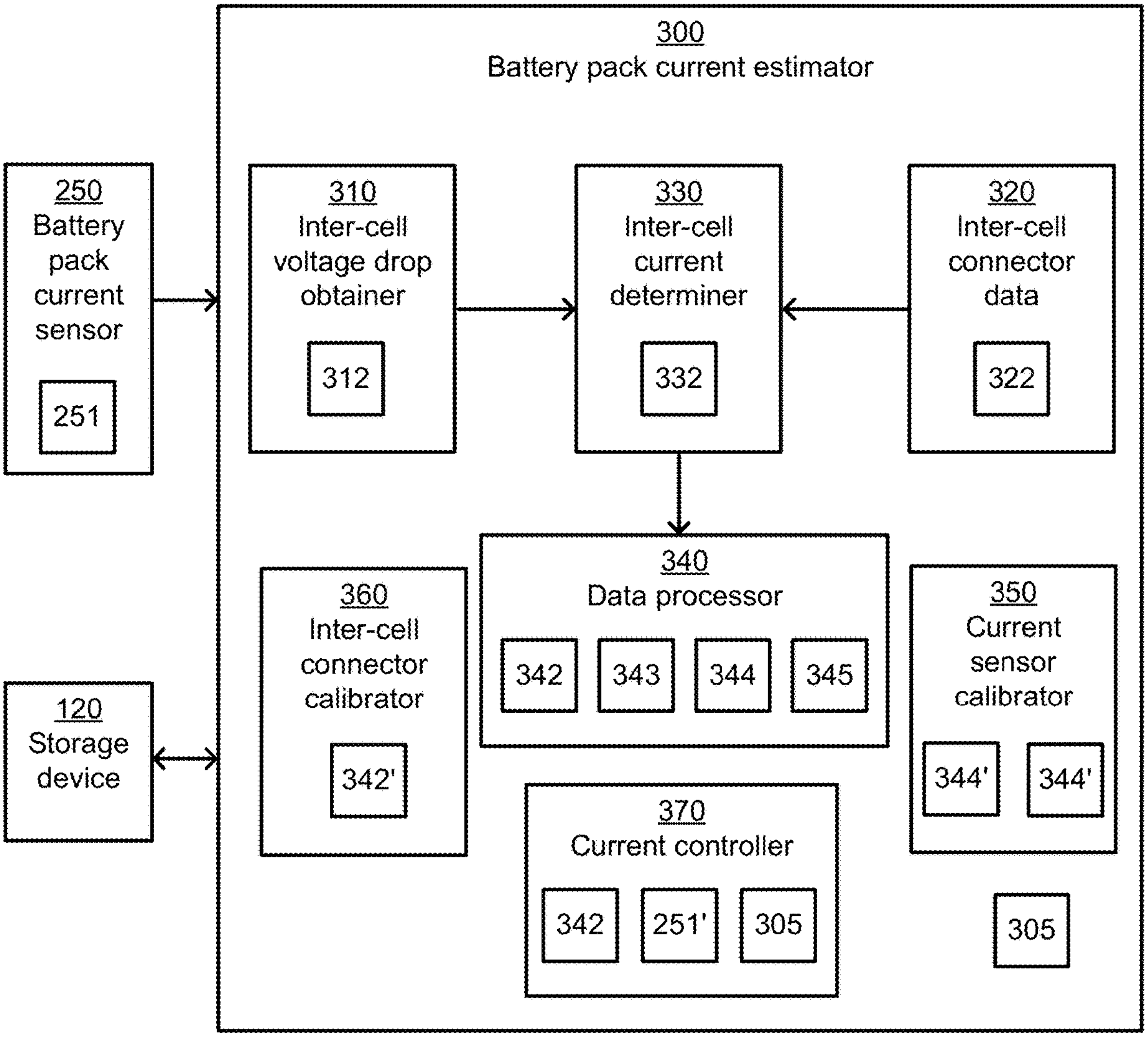
FIG. 4 is an exemplary system diagram of a battery pack current estimator according to an example.

In FIG. 4, a system diagram of a battery pack current estimator 300 is shown. The battery pack current estimator 300 is configured to estimate a battery pack current estimate 305. The battery pack current estimate 305 is an estimate of a current provided or received by one or more battery packs 200 associated with the battery pack current estimator 300. The functions of the battery pack current estimator 300 are advantageously performed by the processing circuitry 110 of the computer system 100 and/or the battery pack processing circuitry 210. It should be mentioned that it may be advantageous to distribute monitoring and supervision of battery cells 210*a*, 210*b*, 210*c*, 210*d* between dedicated cell supervision circuits, e.g. analogue front end (AFE) circuits, arranged proximal to their associated battery cells 210*a*, 210*b*, 210*c*, 210*d*. Such dedicated cell supervision circuits are considered to form part of the battery pack processing circuitry 210. The battery pack current estimator 300 is advantageously configured to receive and/or provide data to the storage device 120 and/or the battery pack current sensor 250.

The battery pack current estimator 300 comprises an inter-cell voltage drop obtainer 310. The inter-cell voltage drop obtainer 310 is configured to obtain voltage drops 312 across a plurality of inter-cell connectors 230. An inter-cell voltage drop 312 is a difference in voltage potential between a first connection point and a second connection point interconnected by one or more inter-cell connectors 230. The inter-cell voltage drops 312, or voltage drops 312 for short, may be obtained by the previously introduced battery pack sensor circuitry 240. An inter-cell voltage drop 312 may be described as associated with the one or more inter-cell connectors 230 across which it is obtained.

In FIG. 4, the battery pack current estimator 300 comprises inter-cell connector data 320. In other examples, the battery pack current estimator 300 may be configured to obtain the inter-cell connector data 320 from the storage device 120. In some examples, some inter-cell connecter data 320 is comprised in the battery pack current estimator 300, and some inter-cell connecter data 320 is stored in the storage device 120. The inter-cell connector data 320 comprises data describing the inter-cell connectors 230. The inter-cell connector data 320 comprises resistance data 322 associated with at least two of the inter-cell connectors 230 of the battery pack 200. The resistance data 322 comprises a resistance value describing an electrical resistance of a plurality of inter-cell connectors 230 of the battery pack 200. The resistance data 322 may comprise a reactance value describing an electrical reactance of a plurality of inter-cell connector 230 of the battery pack 200. The resistance data 322 may be provided as a function of temperature, or compensated based on a temperature of the associated inter-cell connector 230. The inter-cell connector data 320 may describe how the inter-cell connectors 230 of the battery pack 200 are connected. The resistance data 322 may be based on resistance measurements using set currents, for example as a final step of the manufacturing process. In another example, the resistance data 322 may be obtained based on the components comprised in the battery pack 200. Thus, the resistance data 322 may be data calculated based on the components forming the battery pack 200, such as busbars utilized for forming the battery pack 200. The resistance data 322 may be stored in the storage device 120. The battery pack current estimator 300 may be configured to access the storage device 120 to obtain the resistance data 322. The inter-cell connector data 320 may describe a type of a plurality of inter-cell connectors 230 of the battery pack 200. The inter-cell connector data 320 may describe physical characteristics (length, width, current handling capabilities etc.) of a plurality of inter-cell connectors 230 of the battery pack 200. The inter-cell connector data 320 may be stored in the storage device 120. The battery pack current estimator 300 may be configured to access the storage device 120 to obtain the inter-cell connector data 320.

The battery pack current estimator 300 further comprises an inter-cell current determiner 330. The inter-cell current determiner 330 is configured to determine a plurality of inter-cell currents 332. Each inter-cell current 332 is determined based on an inter-cell voltage drop 312 of a specific inter-cell connector 230 (or plurality of specific inter-cell connectors 230) together with resistance data 322 of the specific inter-cell connector 230 (or plurality of specific inter-cell connectors 230). The inter-cell currents 332 are advantageously determined using Ohm's law.

The battery pack current estimator 300 further comprises a data processor 340. The data processor 340 is configured to process the plurality of inter-cell current 332 and determine the battery pack current estimate 305. The data processor 340 may be configured to determine the battery pack current estimate 305 in any suitable way. In one example, the data processor 340 is configured to determine an inter-cell current average 342 of the plurality of inter-cell current 332. The battery pack current estimate 305 may determined by setting the battery pack current estimate 305 to the inter-cell current average 342, or by basing the battery pack current estimate 305 on the inter-cell current average 342. In some examples, the inter-cell current average 342 is an arithmetic mean of the plurality of inter-cell current 332. In some examples, the inter-cell current average 342 is a geometric mean of the plurality of inter-cell current 332. In some examples, the data processor 340 may be configured to determine an inter-cell current estimate standard deviation 343 of the inter-cell current average 342. In some examples, the data processor 340 may be configured to determine a delta current indicator 344. The delta current indicator 344 indicate a difference in current between a battery pack current 251 sensed by the battery pack current sensor 250 and the battery pack current estimate 305. The delta current indicator 344 may consequently be determined by comparison of the battery pack current 251 to the battery pack current estimate 305. In some examples, the data processor 340 may be configured to determine a delta current shift 345. The delta current shift 345 indicate a shift in delta current indicator 344 and may be obtained by comparing a current delta current indicator 344 to one or more previous delta current indicators 344. Advantageously, the delta current shift 345 is determined by comparison of the current delta current indicator 344 to a sliding delta current indicator average provided as a sliding average of a plurality of previous delta current indicators 344.

By determining the battery pack current estimate 305 as the mean of a plurality of inter-cell currents 332, the battery pack current estimates 305 will tend towards a normal distribution, even if the inter-cell currents 332 themselves are not normally distributed. This is known as the central limit theorem. Further to this, by the law of large numbers, the battery pack current estimate 305 converges to the true mean (expected value) of the inter-cell currents 332. As the skilled person understands, this is under assumption that no common offset in the inter-cell currents 332 and that e.g. AD converters provide sufficient resolution. This means that by combining several different, advantageously independent, measurements of the same true battery pack current, the battery pack current estimate 305 may provide a more accurate measure of the true battery pack current than the battery pack current sensor 250 as the number of inter-cell currents 332 increases.

In FIG. 4, the battery pack current estimator 300 comprises an optional current sensor calibrator 350. The current sensor calibrator 350 is configured to monitor data of the battery pack current estimator 300 and determine if the battery pack current sensor 250 is functioning correctly. To this end, the current sensor calibrator 350 may be configured to compare the delta current indicator 344 to a permissible error range 344'. If the delta current indicator 344 is outside the permissible error range 344' the current sensor calibrator 350 may be configured to determine that the battery pack current sensor 250 is malfunctioning. The permissible error range 344' may be a constant predetermined range, a range defined by a percentage of a current delta current indicator 344 or a combination of the two. Additionally, or alternatively, the current sensor calibrator 350 may be configured to compare the delta current shift 345 to a permissible deviation range 345'. If the delta current shift 345 is outside the permissible deviation range 345', the current sensor calibrator 350 may be configured to determine that the battery pack current sensor 250 is malfunctioning. The permissible deviation range 345' may be a constant predetermined range, a range defined by a percentage of a current delta current shift 345 or a combination of the two. The current sensor calibrator 350 is advantageously configured to send an indication of current sensor malfunction to the computer system 100, if the current sensor calibrator 350 determines that the battery pack current sensor 250 is malfunctioning. Additionally, or alternatively, the current sensor calibrator 350 may be configured to calibrate, offset, compensate or otherwise control the battery pack current sensor 250 and/or the battery pack current 251 based on the battery pack current estimate 305 and/or any other data from the data processor 340.

In some examples, battery pack current estimator 300 comprises an inter-cell connector calibrator 360. the inter-cell connector calibrator 360 may be configured to update resistance data 322 of one or more specific inter-cell connector 230 (or plurality of specific inter-cell connectors 230) based on their associated inter cell voltage drops 312 and the battery pack current estimate 305. The resistance data 322 may be updated by setting the resistance data 322 to a resistance value calculated based on the inter cell voltage drop 312 and the battery pack current estimate 305. In some examples, the resistance data 322 may be updated by weighting the resistance data 322 with the resistance value calculated based on the inter cell voltage drop 312 and the battery pack current estimate 305. In some examples, the resistance data 322 may be updated by weighting the resistance data 322 with the resistance value calculated based on the inter cell voltage drop 312 and the battery pack current estimate 305. The weighting may be any suitable weighting, an average etc. Additionally, or alternatively, the inter-cell connector calibrator 360 may be configured to update resistance data 322 correspondingly based on the battery pack current 251. In order to e.g. reduce noise and filter temporary errors, the battery pack current 251 and/or inter cell voltage drop 312 utilized for updating the resistance data 322 may be an average of a plurality of previous battery pack currents 251 and/or inter cell voltage drops 312, i.e. time series data of inter-cell voltage drops 312 and/or battery pack currents 251. Updating of the resistance data 322 is advantageous as it allows the resistance data 322 to be updated and corrected in case of e.g. ageing, damages, etc. of the associated inter-cell connector 230.

Additionally, or alternatively, the inter-cell connector calibrator 360 may be configured to compare the inter-cell current average 342 to a confidence interval 342' of the inter cell current average 342. The confidence interval 342' may be a predefined confidence interval defined as e.g. a percentage, and/or the confidence interval 342' may be defined based on the standard deviation 343 of the inter-cell current average 342. In some examples, the confidence interval 342' may be defined as the standard deviation 343 plus/minus four times the standard deviation 343 of the inter-cell current average 342. In some examples, the confidence interval 342' may be defined as the standard deviation 343 plus/minus five times the standard deviation 343 of the inter-cell current average 342. In some examples, the confidence interval 342' may be defined as the standard deviation 343 plus/minus six times the standard deviation 343 of the inter-cell current average 342. The inter-cell connector calibrator 360 may be configured to determine that any inter cell connectors 230 exhibiting an inter-cell current 332 being outside the confidence interval 342' of the inter-cell current average 342 are malfunctioning. Advantageously, the inter-cell connector calibrator 360 is configured to send an indication of inter-cell connection malfunction to the computer system 100, if the current sensor calibrator 350 determines that one or more inter-cell connectors 230 arc malfunctioning.

Additionally, or alternatively, the inter-cell connector calibrator 360 may be configured to identify inter-cell connector 230 determined to be malfunctioning and the inter cell current determiner 330 may be configured to exclude inter-cell voltages 312 associated with the malfunctioning inter-cell connectors 230 from consecutive estimations of battery back current estimate 305.

In some examples, battery pack current estimator 300 comprises a current controller 370. The current controller 370 may be configured to determine if power (current) should be transfer to from the battery pack 200 at any given point in time. Generally, a battery pack 200 prevent further power going into or being provided by the battery pack 200 if the battery back current 251 was outside an permissible battery current range 251'. However, in the battery pack current estimator 300 of the present disclosure, the current controller 370 may be configured to permit further transfer of power to/from the battery pack 200 even if the battery pack current 251 sensed by the current sensor 250 is outside the permissible battery current range 251'. In one example, the current controller 370 is configured to prevent further power transfer to/from the battery pack 200 if both the battery pack current estimate 305 and the battery pack current 251 are outside the battery current range 251'. That is to say, the current controller 370 may be configured to permit further power transfer to/from the battery pack 200 if the battery pack current estimate 305 is inside the battery pack current range 251' and the battery pack current 251 is outside the battery current range 251'. In some examples, the current controller 370 may be configured to permit further power transfer to/from the battery pack 200 if the battery pack current estimate 305 is outside the battery pack current range 251' and the battery pack current 251 is inside the battery current range 251'. In some examples, the current controller 370 may be configured to permit further power transfer to/from the battery pack 200 if the current sensor 250 is determined to be malfunctioning. In some examples, the current controller 370 may be configured to permit further power transfer to/from the battery pack 200 if the battery pack current estimate 305 is inside the battery pack current range 251' and the current sensor 250 is determined to be malfunctioning. In some examples, the current controller 370 may be configured to permit further power transfer to/from the battery pack 200 at a limited rate if the current sensor 250 is determined to be malfunctioning.

It should be mentioned that the functionality presented herein will allow a statistically accurate measure of a true current provided by or received by a battery pack 200. A risk of unwanted downtime due to inaccurate current measurements is reduced. It is not uncommon for a battery pack 200 suitable for a vehicle 10 to comprise more than 5000 battery cells 210, and well over 9000 battery cells 210 is also commonplace. Each of these cells are connected by a respective inter-cell connector 230 making their associated set of inter-cell voltages 312 well within the range of what may be considered a normal distribution. A group of battery cells 210 is generally connected in parallel (by inter-cell connectors 230) to form what may be referred to as a logical cell. A plurality of logical cells are generally connected in series (by inter-cell connectors 230) and generally voltages between each of these logic cells is monitored by e.g. the battery pack processing circuitry 220. A vehicle 10 generally comprise 100-200 logical cells with inter-cell connectors 230 which also provide a sufficiently large sample size for assuming their averages being normally distributed. As mentioned earlier, generally, not all battery cells 210 are placed in parallel, but generally sets of battery cells 210 are arranged in parallel to obtain a wanted capacitance of the battery pack 200 and these sets are arranged in series to obtain a wanted voltage of the battery pack 200. This will be detailed with a simplified example in FIG. 5A and FIG. 5B.

Figure 5A:
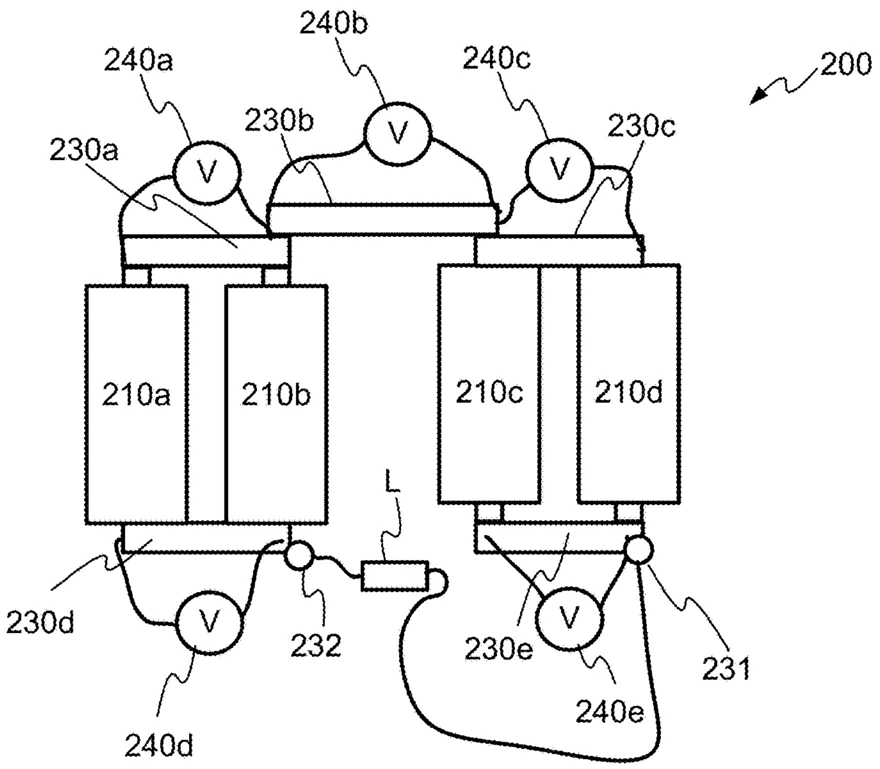
FIG. 5A is an exemplary block view of a battery pack according to an example.

In FIG. 5A, an exemplary schematic view of a partial battery pack 200 is shown. In FIG. 5A, the battery pack 200 comprises a first battery cell 210*a*, a second battery cell 210*b*, a third battery cell 210*c* and a fourth battery cell 210*d*. The first battery cell 210*a* and the second battery cell 210*b* are connected in parallel by a first inter-cell connector 230*a* and a fourth inter-cell connector 230*d*. The third battery cell 210*c* and the fourth battery cell 210*d* are connected in parallel by a third inter-cell connector 230*c* and a fifth inter-cell connector 230*e*. The parallel arrangement of the first battery cell 210*a* and the second battery cell 210*b* is connected in series with the parallel arrangement of the third battery cell 210*c* and the fourth battery cell 210*d* by a second inter-cell connector 230*b*. The first connector 231 is operatively connector to the fifth inter-cell connector 230*e*. The second connector 232 is operatively connector to the fourth inter-cell connector 230*d*. An exemplary load L is connected between the first connector 231 and the second connector 232. In FIG. 5A, a plurality of sensor circuits 240*a*, 240*b*, 240*c*, 240*d*, 240*e* are provided to sense inter-cell voltage drops 312 of their respective inter-cell connector 230*a*, 230*b*, 230*c*, 230*d*, 230*e*. In FIG. 5A, a first sensor circuit 240*a* is arranged to sense an inter-cell voltage drop across the first inter-cell connector 230*a*, a second sensor circuit 240*b* is arranged to sense an inter-cell voltage drop across the second inter-cell connector 230*b*, a third sensor circuit 240*c* is arranged to sense an inter-cell voltage drop across the third inter-cell connector 230*c*, an inter-cell fourth sensor circuit 240*d* is arranged to sense a voltage drop across the fourth inter-cell connector 230*d*, and a fifth sensor circuit 240*e* is arranged to sense an inter-cell voltage drop across the fifth inter-cell connector 230*e*. In some examples, a specific sensor circuit 240*a*, 240*b*, 240*c*, 240*d*, 240*e*, 240*f* may be configured to selectively sense voltage drops of more than one inter-cell connector 230*a*, 230*b*, 230*c*, 230*d*, 230*e*, 230*f*. In some examples, a specific sensor circuit 240*a*, 240*b*, 240*c*, 240*d*, 240*e*, 240*f* may be configured to sense a voltage drop of two or more inter-cell connector 230*a*, 230*b*, 230*c*, 230*d*, 230*e*, 230*f* in series.

Figure 5B:
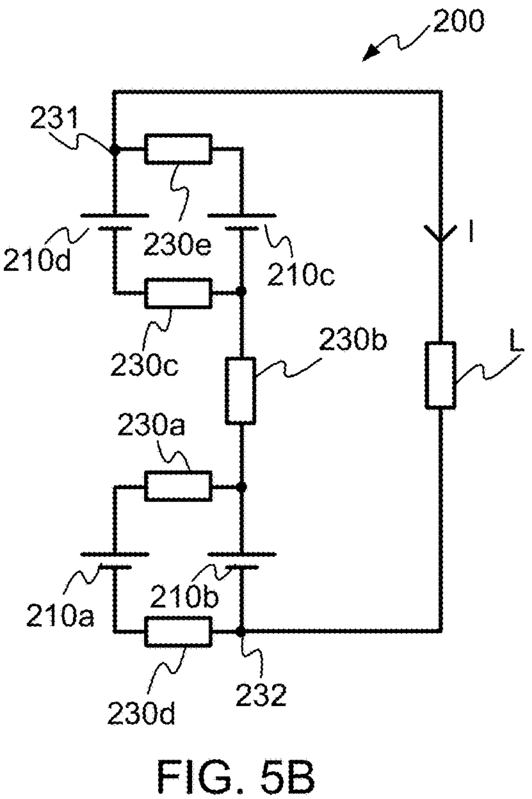
FIG. 5B is an exemplary circuit schematic of a battery pack according to an example.

In FIG. 5B, a schematic of the battery pack 200 of FIG. 5A is shown. A current I is provided from the battery pack 200 to the load L. In the following, ideal components are assumed. As the skilled person will appreciate, the current I is equal to an inter-cell current 332 through the second inter-cell connector 230*b*. The current I is also equal to a sum of the inter-cell currents 332 through the third inter-cell connector 230*c* and the fifth inter-cell connector 230*e*. Further, the current I is also equal to a sum of the inter-cell currents 332 through the first inter-cell connector 230*a* and the second inter-cell connector 230*d*. In other words, the current I through the load L may be determined by combinations of inter-cell currents 332 and must not be determined directly from a resistance data 322 and inter-cell voltage 312 of a respective inter-cell connector 230.

Figure 6:
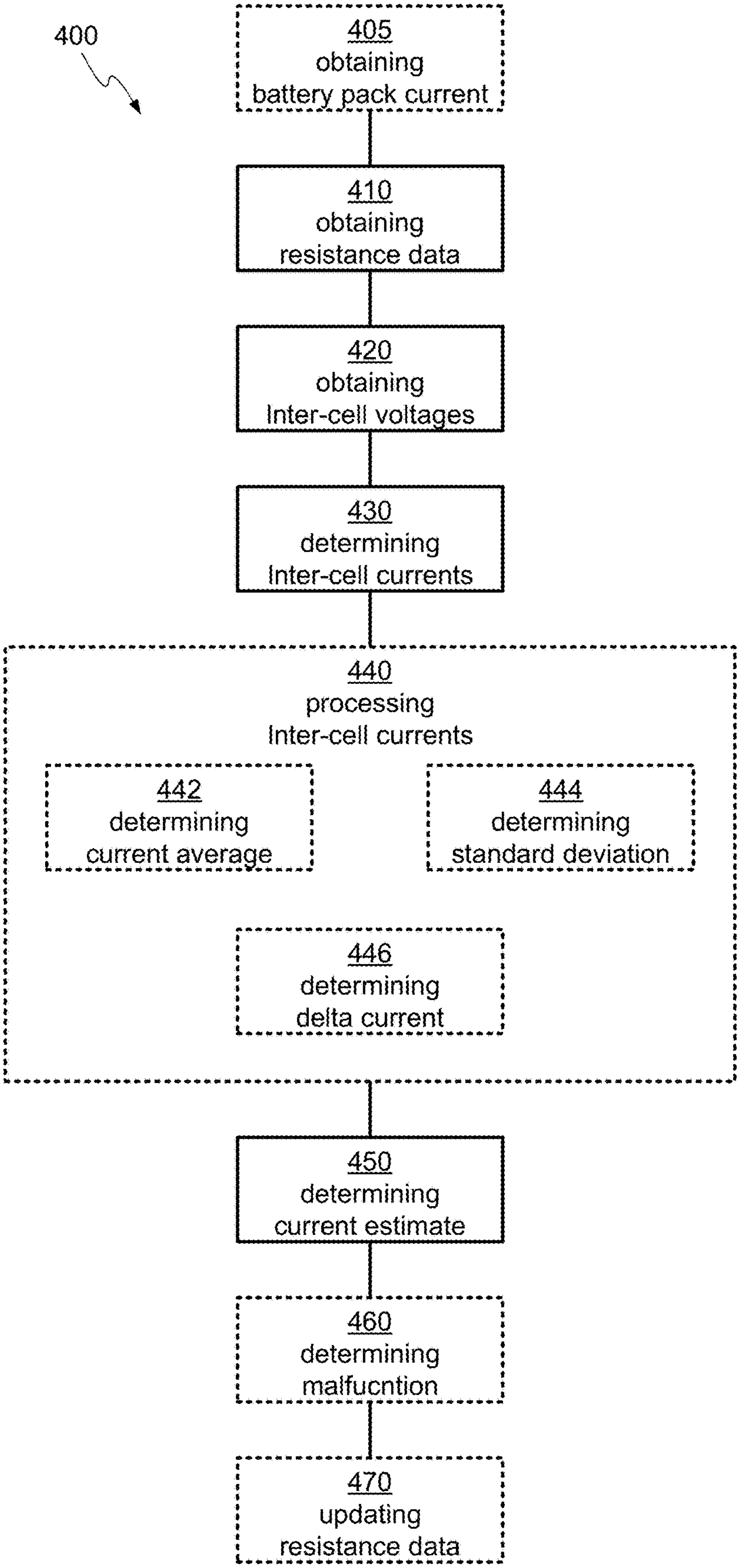
FIG. 6 is an exemplary diagram of a method for estimating a current from a battery pack according to an example.

In FIG. 6, a method 400 for providing a current estimate 305 of a our from, or into, a battery pack 200. The method 400 is advantageously a computer implemented method that may be performed by the computer system 100 presented herein, specifically by processing circuitry 110 of the computer system 100. In some examples, the processing circuitry 110 of the computer system 100 may be configured to cause execution of the method 400 rather than executing the method 400 itself. The method 400 should not be considered limited to the features presented in reference to FIG. 6, but may advantageously be expanded to comprise any feature, function or example described in the present disclosure, specifically those described in reference to FIG. 4.

The method 400 comprises obtaining 410 resistance data 322 of a plurality of inter-cell connectors 230 of the battery pack 200. This may comprise, as previously indicated, reading resistance data 322, or inter-cell connector data 320, from a storage device 120. The method 400 further comprises obtaining 420 inter-cell voltage drops 312 across the plurality of inter-cell connectors 230. This may, as previously described, be achieved by configuring one or more battery pack sensor circuitry 240 to measure, sense or otherwise obtain the inter-cell voltage drops 312. The method 400 further comprises determining 430 inter-cell currents 332 based on the resistance data 322 and associated inter-cell voltage drops 312. This may, as previously described, be achieved by calculation using Ohm's law. The method 400 further comprises determining 450 the battery pack current estimate 305 an estimate of the battery pack current 251 based on the inter-cell currents 332. This may be achieved by e.g. setting the estimate of the pack currents 305 to one of the inter-cell currents 332.

Optionally, in some examples, the method 400 may comprise processing 440 of the inter-cell currents 332. The processing 440 may, as previously indicated, be performed in a number of different ways. In some examples, the processing 440 comprises determining 442 the inter-cell current average 342 of the inter-cell currents 332. The inter-cell current average 342 may, as previously described, be e.g. an arithmetic mean, a geometric mean etc. The processing 440 may further comprise determining 444 the inter-cell current estimate standard deviation 343 of the inter-cell current average 342. Additionally, or alternatively, the processing 440 may comprise determining 446 the delta current indicator 344. The delta current indicator 344 is advantageously determined by comparison of the battery pack current 251 and the battery pack current estimate 305. To this, or any other suitable end, in some examples, the method 400 may comprise obtaining 405 the battery pack current 251, advantageously from the current sensor 250 of the battery pack 200. The determining 450 of the current estimate advantageously utilizes one or more of the inter-cell current average 342, the inter-cell current estimate standard deviation 343 and/or the delta current indicator 344 in determining the battery pack current estimate 305.

The method may comprise, as previously described, determining 460 that the batter pack current sensor 250 and/or one or more inter-cell connectors 230 are malfunctioning based on e.g. the inter-cell current average 342, the inter-cell current estimate standard deviation 343 and/or the delta current indicator 344.

Optionally, in some examples, the method 400 may comprise, as previously described updating 470 the resistance data 322 and/or the inter-cell connector data 320 based on one or more of the inter-cell voltage drops 312, the inter-cell currents 332, the inter-cell current average 342, the inter-cell current estimate standard deviation 343, the delta current indicator 344, etc. Correspondingly, the method 400 may comprise calibrating (not shown), the battery pack current sensor 250 based on one or more of the inter-cell voltage drops 312, the inter-cell currents 332, the inter-cell current average 342, the inter-cell current estimate standard deviation 343, the delta current indicator 344, etc.

Figure 7:
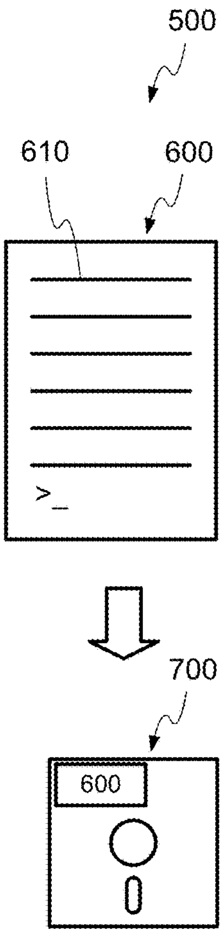
FIG. 7 is an exemplary block diagram of a computer program product.

In FIG. 7 a computer program product 500 is shown. The computer program product 500 comprises a computer program 600 and a non-transitory computer readable medium 700. The computer program 600 is advantageously stored on the computer readable medium 700. The computer readable medium 700 is, in FIG. 7, exemplified as a vintage 5,25" floppy disc, but may be embodied as any suitable non-transitory computer readable medium such as, but not limited to, hard disk drives (HDDs), solid-state drives (SSDs), optical discs (e.g., CD-ROM, DVD-ROM, CD-RW, DVD-RW), USB flash drives, magnetic tapes, memory cards, Read-Only Memories (ROM), network-attached storage (NAS), cloud storage etc.

The computer program 600 comprises instruction 610 e.g. program instruction, software code, that, when executed by processing circuitry cause the processing circuitry to perform the method 400 described herein with reference to FIG. 6.

It should be mentioned that the teachings of the present disclosure are equally applicable to other loads than propulsion sources, and implementations in other fields than transportation and vehicles. Any system, device or arrangement powered by a battery pack wherein accurate, or redundant, estimates of currents is beneficial, may benefit from the present disclosure. Such system, device or arrangement may reside in the field of industrial applications or marine vessels, such as water crafts, motorboats, work boats, sport vessels, boats, ships, among other vessel types.

Figure 8:
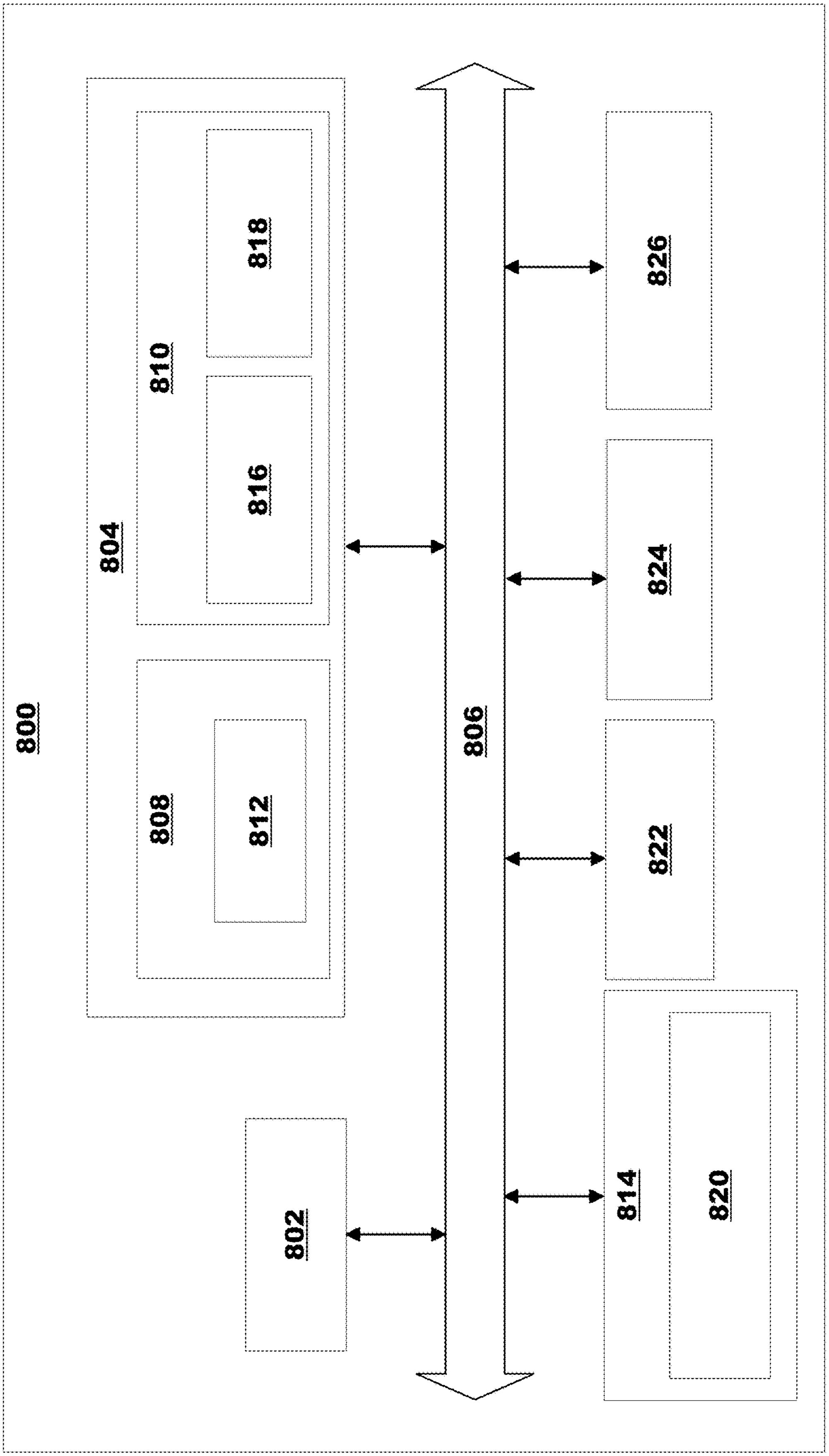
FIG. 8 is a schematic diagram of an exemplary computer system for implementing examples disclosed herein, according to an example.

FIG. 8 is a schematic diagram of a computer system 800 for implementing examples disclosed herein. The computer system 800 may be the computer system 100 introduced with reference to FIG. 1A. The computer system 800 is adapted to execute instructions from a computer-readable medium to perform these and/or any of the functions or processing described herein. The computer system 800 may be connected (e.g., networked) to other machines in a LAN, an intranet, an extranet, or the Internet. While only a single device is illustrated, the computer system 800 may include any collection of devices that individually or jointly execute a set (or multiple sets) of instructions to perform any one or more of the methodologies discussed herein. Accordingly, any reference in the disclosure and/or claims to a computer system, computing system, computer device, computing device, control system, control unit, electronic control unit (ECU), processor device, processing circuitry, etc., includes reference to one or more such devices to individually or jointly execute a set (or multiple sets) of instructions to perform any one or more of the methodologies discussed herein. For example, control system may include a single control unit or a plurality of control units connected or otherwise communicatively coupled to each other, such that any performed function may be distributed between the control units as desired. Further, such devices may communicate with each other or other devices by various system architectures, such as directly or via a Controller Area Network (CAN) bus, etc.

The computer system 800 may comprise at least one computing device or electronic device capable of including firmware, hardware, and/or executing software instructions to implement the functionality described herein. The computer system 800 may include processing circuitry 802 (e.g., processing circuitry including one or more processor devices or control units), a memory 804, and a system bus 806. The processing circuitry 802 may be, or comprise, the processing circuitry 110 introduced with reference to FIG. 1B. The computer system 800 may include at least one computing device having the processing circuitry 802. The system bus 806 provides an interface for system components including, but not limited to, the memory 804 and the processing circuitry 802. The processing circuitry 802 may include any number of hardware components for conducting data or signal processing or for executing computer code stored in memory 804. The processing circuitry 802 may, for example, include a general-purpose processor, an application specific processor, a Digital Signal Processor (DSP), an Application Specific Integrated Circuit (ASIC), a Field Programmable Gate Array (FPGA), a circuit containing processing components, a group of distributed processing components, a group of distributed computers configured for processing, or other programmable logic device, discrete gate or transistor logic, discrete hardware components, or any combination thereof designed to perform the functions described herein. The processing circuitry 802 may further include computer executable code that controls operation of the programmable device.

The system bus 806 may be any of several types of bus structures that may further interconnect to a memory bus (with or without a memory controller), a peripheral bus, and/or a local bus using any of a variety of bus architectures. The memory 804 may be one or more devices for storing data and/or computer code for completing or facilitating methods described herein. The memory 804 may include database components, object code components, script components, or other types of information structure for supporting the various activities herein. Any distributed or local memory device may be utilized with the systems and methods of this description. The memory 804 may be communicably connected to the processing circuitry 802 (e.g., via a circuit or any other wired, wireless, or network connection) and may include computer code for executing one or more processes described herein. The memory 804 may include non-volatile memory 808 (e.g., read-only memory (ROM), erasable programmable read-only memory (EPROM), electrically erasable programmable read-only memory (EEPROM), etc.), and volatile memory 810 (e.g., random-access memory (RAM)), or any other medium which can be used to carry or store desired program code in the form of machine-executable instructions or data structures and which can be accessed by a computer or other machine with processing circuitry 802. A basic input/output system (BIOS) 812 may be stored in the non-volatile memory 808 and can include the basic routines that help to transfer information between elements within the computer system 800.

The computer system 800 may further include or be coupled to a non-transitory computer-readable storage medium such as the storage device 814, which may comprise, for example, an internal or external hard disk drive (HDD) (e.g., enhanced integrated drive electronics (EIDE)

or serial advanced technology attachment (SATA)), HDD (e.g., EIDE or SATA) for storage, flash memory, or the like. The storage device 814 and other drives associated with computer-readable media and computer-usable media may provide non-volatile storage of data, data structures, computer-executable instructions, and the like.

Computer-code which is hard or soft coded may be provided in the form of one or more modules. The module(s) can be implemented as software and/or hard-coded in circuitry to implement the functionality described herein in whole or in part. The modules may be stored in the storage device 814 and/or in the volatile memory 810, which may include an operating system 816 and/or one or more program modules 818. All or a portion of the examples disclosed herein may be implemented as a computer program 820 stored on a transitory or non-transitory computer-usable or computer-readable storage medium (e.g., single medium or multiple media), such as the storage device 814, which includes complex programming instructions (e.g., complex computer-readable program code) to cause the processing circuitry 802 to carry out actions described herein. Thus, the computer-readable program code of the computer program 820 can comprise software instructions for implementing the functionality of the examples described herein when executed by the processing circuitry 802. In some examples, the storage device 814 may be a computer program product (e.g., readable storage medium) storing the computer program 820 thereon, where at least a portion of a computer program 820 may be loadable (e.g., into a processor) for implementing the functionality of the examples described herein when executed by the processing circuitry 802. The processing circuitry 802 may serve as a controller or control system for the computer system 800 that is to implement the functionality described herein.

The computer system 800 may include an input device interface 822 configured to receive input and selections to be communicated to the computer system 800 when executing instructions, such as from a keyboard, mouse, touch-sensitive surface, etc. Such input devices may be connected to the processing circuitry 802 through the input device interface 822 coupled to the system bus 806 but can be connected through other interfaces, such as a parallel port, an Institute of Electrical and Electronic Engineers (IEEE) 1394 serial port, a Universal Serial Bus (USB) port, an IR interface, and the like. The computer system 800 may include an output device interface 824 configured to forward output, such as to a display, a video display unit (e.g., a liquid crystal display (LCD) or a cathode ray tube (CRT)). The computer system 800 may include a communications interface 826 suitable for communicating with a network as appropriate or desired.

The operational actions described in any of the exemplary aspects herein are described to provide examples and discussion. The actions may be performed by hardware components, may be embodied in machine-executable instructions to cause a processor to perform the actions, or may be performed by a combination of hardware and software. Although a specific order of method actions may be shown or described, the order of the actions may differ. In addition, two or more actions may be performed concurrently or with partial concurrence.

Example 1. A computer system 100 comprising processing circuitry 110 configured to: obtain resistance data 322 of a plurality of inter-cell connectors 230 of a battery pack 200 comprising a plurality of battery cells 210*a*, 210*b*, 210*c*, 210*d*, obtain inter-cell voltage drops 312 across the plurality of inter-cell connectors 230, determine inter-cell currents 332 based on the resistance data 322 and associated inter-cell voltage drops 312, and determine a battery pack current estimate 305 of a battery pack current 251 of the battery pack 200 based on the inter-cell currents 332.

Example 2. The computer system 100 of example 1, wherein the processing circuitry 110 is further configured to: determine an inter-cell current average 342 as a mean of the inter-cell currents 332, and determine the battery pack current estimate 305 based on the inter-cell current average 342.

Example 3. The computer system 100 of example 2, wherein the processing circuitry 110 is further configured to: determine an inter-cell current estimate standard deviation 343 as a standard deviation of the inter-cell current average 342, for each inter-cell connector 230 exhibiting an inter-cell current being outside a predefined confidence interval 342' of the inter-cell current average 342, determine that the inter-cell connector 230 is malfunctioning.

Example 4. The computer system 100 of example 2 or 3, wherein the processing circuitry 110 is further configured to: determining the average of inter-cell current average 342 as an arithmetic mean of the inter-cell currents 332.

Example 5. The computer system 100 of example 2 or 3, wherein the processing circuitry 110 is further configured to: determining the inter-cell current average 342 as a geometric mean of the inter-cell currents 332.

Example 6. The computer system 100 of any one of examples 1 to 5, wherein the processing circuitry 110 is further configured to: obtain, from a battery pack current sensor 250, a battery pack current 251 of the battery pack 200, determine a delta current indicator 344 by comparison of the battery pack current 251 and the battery pack current estimate 305, and responsive to the delta current indicator 344 being outside a permissible error range 344', determining that the battery pack current sensor 250 is malfunctioning.

Example 7. The computer system 100 of example 6, wherein the processing circuitry 110 is further configured to: determine a delta current shift 345 by comparison of the delta current indicator 344 with one or more previous delta current indicators 344, and responsive to the delta current shift 345 being outside a permissible deviation range 345', determining that the battery pack current sensor 250 is malfunctioning.

Example 8. The computer system 100 of example 7, wherein the processing circuitry 110 is further configured to: determine the delta current shift 345 by a comparison of the delta current indicator 344 with a sliding delta current indicator average of a plurality previous delta current indicators 344.

Example 9. The computer system 100 of any one of examples 6 to 8, wherein the processing circuitry 110 is further configured to: responsive to determining that the battery pack current sensor 250 is malfunctioning, determine that further transfer of power to/from the battery pack 200 is allowed based on the battery pack current estimate 305.

Example 10. The computer system 100 of any one of examples 1 to 9, wherein the processing circuitry 110 is further configured to: update the resistance data 322 of one or more of the plurality of inter-cell connectors 230 based on the battery pack current estimate 305 and inter-cell voltage drops 312 across the plurality of inter-cell connectors 230, and/or time series data of inter-cell voltage drops 312 across the plurality of inter-cell connectors 230.

Example 11. The computer system 100 of any one of examples 6 to 10, wherein the processing circuitry 110 is further configured to: update the resistance data 322 based on the battery pack current 251.

Example 12. The computer system 100 of any one of examples 3 to 11, wherein the processing circuitry 110 is further configured to: exclude inter-cell currents associated with an inter-cell connector 230 determined to be malfunctioning from determining of a subsequent battery pack current estimate 305.

Example 13. The computer system 100 of example 1, wherein the processing circuitry 110 is further configured to: determine an inter-cell current average 342 as a mean of the inter-cell currents 332, and determine the battery pack current estimate 305 based on the inter-cell current average 342; determine an inter-cell current estimate standard deviation 343 as a standard deviation of the inter-cell current average 342, for each inter-cell connector 230 exhibiting an inter-cell current being outside a predefined confidence interval 342' of the inter-cell current average 342, determine that the inter-cell connector 230 is malfunctioning; determine the average of inter-cell current average 342 as an arithmetic mean of the inter-cell currents 332 or determine the inter-cell current average 342 as a geometric mean of the inter-cell currents 332; obtain, from a battery pack current sensor 250, a battery pack current 251 of the battery pack current 251, determine a delta current indicator 344 by comparison of the battery pack current 251 and the battery pack current estimate 305, and responsive to the delta current indicator 344 being outside a permissible error range 344', determining that the battery pack current sensor 250 is malfunctioning; determine a delta current shift 345 by comparison of the delta current indicator 344 with one or more previous delta current indicators 344, and responsive to the delta current shift 345 being outside a permissible deviation range 345', determining that the battery pack current sensor 250 is malfunctioning; determine the delta current shift 345 by a comparison of the delta current indicator 344 with a sliding delta current indicator average of a plurality previous delta current indicators 344; responsive to determining that the battery pack current sensor 250 is malfunctioning, determine that further transfer of power to/from the battery pack 200 is allowed based on the battery pack current estimate 305; update the resistance data 322 of one or more of the plurality of inter-cell connectors 230 based on the battery pack current estimate 305 and inter-cell voltage drops 312 across the plurality of inter-cell connectors 230, and/or time series data of inter-cell voltage drops 312 across the plurality of inter-cell connectors 230; update the resistance data 322 based on the battery pack current 251; and exclude inter-cell currents associated with an inter-cell connector 230 determined to be malfunctioning from determining of a subsequent battery pack current estimate 305.

Example 14. A vehicle 10 comprising an electric propulsion source, a battery pack 200 operatively connected to the computer system 100 of any one of examples 1 to 13 and configured to provide power to the electric propulsion source.

Example 15. The vehicle 10 of example 14, wherein the vehicle 10 is a heavy-duty vehicle 10.

Example 16. A computer implemented method 400 comprising: obtaining 410, by a processing circuitry of a computer system 100, resistance data 322 of a plurality of inter-cell connectors 230 of a battery pack 200 comprising a plurality of battery cells 210*a*, 210*b*, 210*c*, 210*d*, obtaining 420, by the processing circuitry of the computer system 100, inter-cell voltage drops 312 across the plurality of inter-cell connectors 230, determining 430, by the processing circuitry of the computer system 100, inter-cell currents 332 based on the resistance data 322 and associated inter-cell voltage drops 312, and determining 450, by the processing circuitry of the computer system 100, a battery pack current estimate 305 of a battery pack current 251 of the battery pack 200 based on the inter-cell currents 332.

Example 17. The computer implemented method 400 of example 16, further comprising: determining 442, by the processing circuitry of the computer system 100, an inter-cell current average 342 as a mean of the inter-cell currents 332, and determining 450, by the processing circuitry of the computer system 100, the battery pack current estimate 305 based on the inter-cell current average 342.

Example 18. The computer implemented method 400 of example 17, further comprising: determining 444, by the processing circuitry of the computer system 100, an inter-cell current estimate standard deviation 343 as a standard deviation of the inter-cell current average 342, for each inter-cell connector 230 exhibiting an inter-cell current 332 being outside a predefined confidence interval 342' of the inter-cell current average 342, determining, by the processing circuitry of the computer system 100, that the inter-cell connector 230 is malfunctioning.

Example 19. The computer implemented method 400 of example 18 or 19 further comprising: determining 442, by the processing circuitry of the computer system 100, the average of the inter-cell current average 342 as an arithmetic mean of the inter-cell currents 332.

Example 20. The computer implemented method 400 of example 17 or 18 further comprising: determining 442, by the processing circuitry of the computer system 100, the average of the inter-cell current average 342 as a geometric mean of the inter-cell currents 332.

Example 21. The computer implemented method 400 of any one of examples 16 to 20 further comprising: obtaining 405, by the processing circuitry of the computer system 100, from a battery pack current sensor 250, a battery pack current 251 of the battery pack current 251, determining 446, by the processing circuitry of the computer system 100, a delta current indicator 344 by comparison of the battery pack current 251 and the battery pack current estimate 305, and responsive to the delta current indicator 344 being outside a permissible error range 344', determining 460, by the processing circuitry of the computer system 100, that the battery pack current sensor 250 is malfunctioning.

Example 22. The computer implemented method 400 of example 21 further comprising: determining 446, by the processing circuitry of the computer system 100, a delta current shift 345 by comparison of the delta current indicator 344 with one or more previous delta current indicators 344, and responsive to the delta current shift 345 being outside a permissible deviation range 345', determining 460, by the processing circuitry of the computer system 100, that the battery pack current sensor 250 is malfunctioning.

Example 23. The computer implemented method 400 of example 22 further comprising: determining 446, by the processing circuitry of the computer system 100, the delta current shift 345 by a comparison of the delta current indicator 344 with a sliding delta current indicator average of a plurality previous delta current indicators 344.

Example 24. The computer implemented method 400 of any one of examples 21 to 23 further comprising: responsive to determining that the battery pack current sensor 250 is malfunctioning, determining, by the processing circuitry of the computer system 100, that further transfer of power to/from the battery pack 200 is allowed based on the battery pack current estimate 305.

Example 25. The computer implemented method 400 of any one of examples 16 to 24 further comprising: updating 470, by the processing circuitry of the computer system 100, the resistance data 322 of one or more of the plurality of inter-cell connectors 230 based on the battery pack current estimate 305 and inter-cell voltage drops 312 across the plurality of inter-cell connectors 230, and/or time series data of inter-cell voltage drops 312 across the plurality of inter-cell connectors 230.

Example 26. The computer implemented method 400 of any one of examples 16 to 25, further comprising: updating 470, by the processing circuitry of the computer system 100, the resistance data 322 based on the battery pack current 251.

Example 27. The computer implemented method 400 of any one of examples 16 to 26, further comprising: excluding, by the processing circuitry of the computer system 100, inter-cell currents associated with an inter-cell connector 230 determined to be malfunctioning from determining of a subsequent battery pack current estimate 305.

Example 28. A computer program product comprising program code for performing, when executed by the processing circuitry, the method of any of examples 16 to 27.

Example 29. A non-transitory computer-readable storage medium comprising instructions, which when executed by the processing circuitry, cause the processing circuitry to perform the method of any of examples 16 to 27.

The terminology used herein is for the purpose of describing particular aspects only and is not intended to be limiting of the disclosure. As used herein, the singular forms "a," "an," and "the" are intended to include the plural forms as well, unless the context clearly indicates otherwise. As used herein, the term "and/or" includes any and all combinations of one or more of the associated listed items. It will be further understood that the terms "comprises," "comprising," "includes," and/or "including" when used herein specify the presence of stated features, integers, actions, steps, operations, elements, and/or components, but do not preclude the presence or addition of one or more other features, integers, actions, steps, operations, elements, components, and/or groups thereof.

It will be understood that, although the terms first, second, etc., may be used herein to describe various elements, these elements should not be limited by these terms. These terms are only used to distinguish one element from another. For example, a first element could be termed a second element, and, similarly, a second element could be termed a first element without departing from the scope of the present disclosure.

Relative terms such as "below" or "above" or "upper" or "lower" or "horizontal" or "vertical" may be used herein to describe a relationship of one element to another element as illustrated in the Figures. It will be understood that these terms and those discussed above are intended to encompass different orientations of the device in addition to the orientation depicted in the Figures. It will be understood that when an element is referred to as being "connected" or "coupled" to another element, it can be directly connected or coupled to the other element, or intervening elements may be present. In contrast, when an element is referred to as being "directly connected" or "directly coupled" to another element, there are no intervening elements present.

Unless otherwise defined, all terms (including technical and scientific terms) used herein have the same meaning as commonly understood by one of ordinary skill in the art to which this disclosure belongs. It will be further understood that terms used herein should be interpreted as having a meaning consistent with their meaning in the context of this specification and the relevant art and will not be interpreted in an idealized or overly formal sense unless expressly so defined herein.

It is to be understood that the present disclosure is not limited to the aspects described above and illustrated in the drawings; rather, the skilled person will recognize that many changes and modifications may be made within the scope of the present disclosure and appended claims. In the drawings and specification, there have been disclosed aspects for purposes of illustration only and not for purposes of limitation, the scope of the disclosure being set forth in the following claims.

What is claimed is:

1. A computer system comprising processing circuitry configured to:

obtain resistance data of a plurality of inter-cell connectors of a battery pack comprising a plurality of battery cells, obtain inter-cell voltage drops across the plurality of inter-cell connectors, determine inter-cell currents based on the resistance data and associated inter-cell voltage drops, determine a battery pack current estimate of a battery pack current of the battery pack based on the inter-cell currents, obtain, from a battery pack current sensor, a battery pack current of the battery pack, determine a delta current indicator by comparison of the battery pack current and the battery pack current estimate, and responsive to the delta current indicator being outside a permissible error range, determining that the battery pack current sensor is malfunctioning.

2. The computer system of claim 1, wherein the processing circuitry is further configured to:

determine an inter-cell current average as a mean of the inter-cell currents, and determine the battery pack current estimate based on the inter-cell current average.

3. The computer system of claim 2, wherein the processing circuitry is further configured to:

determine an inter-cell current estimate standard deviation as a standard deviation of the inter-cell current average, for each inter-cell connector exhibiting an inter-cell current being outside a predefined confidence interval of the inter-cell current average, determine that the inter-cell connector is malfunctioning.

4. The computer system of claim 2, wherein the processing circuitry is further configured to:

determining the average of inter-cell current average as an arithmetic mean of the inter-cell currents.

5. The computer system of claim 2, wherein the processing circuitry is further configured to:

determining the inter-cell current average as a geometric mean of the inter-cell currents.

6. The computer system of claim 1, wherein the processing circuitry is further configured to:

determine a delta current shift by comparison of the delta current indicator with one or more previous delta current indicators, and responsive to the delta current shift being outside a permissible deviation range, determining that the battery pack current sensor is malfunctioning.

7. The computer system of claim 6, wherein the processing circuitry is further configured to:

determine the delta current shift by a comparison of the delta current indicator with a sliding delta current indicator average of a plurality previous delta current indicators.

8. The computer system of claim 1, wherein the processing circuitry is further configured to:

responsive to determining that the battery pack current sensor is malfunctioning, determine that further transfer of power to/from the battery pack is allowed based on the battery pack current estimate.

9. The computer system of claim 1, wherein the processing circuitry is further configured to:

update the resistance data of one or more of the plurality of inter-cell connectors based on the battery pack current estimate and inter-cell voltage drops across the plurality of inter-cell connectors, and/or based on time series data of inter-cell voltage drops across the plurality of inter-cell connectors and/or based on a battery pack current obtained from a battery pack current sensor of the battery pack.

10. The computer system of claim 1, wherein the processing circuitry is further configured to:

update the resistance data based on the battery pack current.

11. The computer system of claim 1, wherein the processing circuitry is further configured to: determine an inter-cell current average as a mean of the inter-cell currents, and determine the battery pack current estimate based on the inter-cell current average; determine an inter-cell current estimate standard deviation as a standard deviation of the inter-cell current average, for each inter-cell connector exhibiting an inter-cell current being outside a predefined confidence interval of the inter-cell current average, determine that the inter-cell connector is malfunctioning; obtain, from a battery pack current sensor, a battery pack current of the battery pack current, determine a delta current indicator by comparison of the battery pack current and the battery pack current estimate, and responsive to the delta current indicator being outside a permissible error range, determining that the battery pack current sensor is malfunctioning; responsive to determining that the battery pack current sensor is malfunctioning, determine that further transfer of power to/from the battery pack is allowed based on the battery pack current estimate; and update the resistance data of one or more of the plurality of inter-cell connectors based on the battery pack current estimate and inter-cell voltage drops across the plurality of inter-cell connectors, and/or time series data of inter-cell voltage drops across the plurality of inter-cell connectors.

12. A vehicle comprising an electric propulsion source, a battery pack operatively connected to the computer system of claim 1 and configured to provide power to the electric propulsion source, preferably, the vehicle is a heavy-duty vehicle.

13. A computer implemented method comprising:

obtaining, by a processing circuitry of a computer system, resistance data of a plurality of inter-cell connectors of a battery pack comprising a plurality of battery cells, obtaining, by the processing circuitry of the computer system, inter-cell voltage drops across the plurality of inter-cell connectors, determining, by the processing circuitry of the computer system, inter-cell currents based on the resistance data and associated inter-cell voltage drops, determining, by the processing circuitry of the computer system, a battery pack current estimate of a battery pack current of the battery pack based on the inter-cell currents, obtaining, by the processing circuitry of the computer system, from a battery pack current sensor, a battery pack current of the battery pack current, determining, by the processing circuitry of the computer system, a delta current indicator by comparison of the battery pack current and the battery pack current estimate, and responsive to the delta current indicator being outside a permissible error range, and determining, by the processing circuitry of the computer system, that the battery pack current sensor is malfunctioning.

14. The computer implemented method of claim 13, further comprising:

determining, by the processing circuitry of the computer system, an inter-cell current average as a mean of the inter-cell currents, and determining, by the processing circuitry of the computer system, the battery pack current estimate based on the inter-cell current average.

15. The computer implemented method of claim 14, further comprising:

determining, by the processing circuitry of the computer system, an inter-cell current estimate standard deviation as a standard deviation of the inter-cell current average, for each inter-cell connector exhibiting an inter-cell current being outside a predefined confidence interval of the inter-cell current average, determining, by the processing circuitry of the computer system, that the inter-cell connector is malfunctioning.

16. The computer implemented method of claim 13, further comprising:

responsive to determining that the battery pack current sensor is malfunctioning, determining, by the processing circuitry of the computer system, that further transfer of power to/from the battery pack is allowed based on the battery pack current estimate.

17. A non-transitory computer-readable storage medium comprising instructions, which when executed by a processing circuitry, cause the processing circuitry to perform the method of claim 13.

* * * * *